United States Patent
Chino et al.

(10) Patent No.: US 12,267,953 B2
(45) Date of Patent: Apr. 1, 2025

(54) WIRING BOARD

(71) Applicant: SHINKO ELECTRIC INDUSTRIES CO., LTD., Nagano (JP)

(72) Inventors: Yukari Chino, Nagano (JP); Hideki Ito, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 162 days.

(21) Appl. No.: 17/992,081

(22) Filed: Nov. 22, 2022

(65) Prior Publication Data

US 2023/0171883 A1    Jun. 1, 2023

(30) Foreign Application Priority Data

Nov. 26, 2021  (JP) ................................ 2021-192209

(51) Int. Cl.
  *H05K 1/02*  (2006.01)
  *H05K 1/11*  (2006.01)

(52) U.S. Cl.
  CPC ........... *H05K 1/0298* (2013.01); *H05K 1/115* (2013.01)

(58) Field of Classification Search
  CPC .. H05K 1/0228; H05K 1/0242; H05K 1/0298; H05K 1/115
  See application file for complete search history.

(56) References Cited

U.S. PATENT DOCUMENTS

| 5,184,095 A * | 2/1993 | Hanz .................... H05K 1/025 333/33 |
| 10,218,397 B1 * | 2/2019 | Gundrum ............... B81B 7/0048 |
| 10,218,937 B2 | 2/2019 | Wang |
| 2017/0064825 A1 * | 3/2017 | Ishihara ............... H05K 1/0298 |

FOREIGN PATENT DOCUMENTS

| JP | H5-235612 A | 9/1993 |
| JP | H09-018097 | 1/1997 |
| JP | 2010-212438 A | 9/2010 |

OTHER PUBLICATIONS

Japanese Office Action mailed Jan. 28, 2025 issued in corresponding Japanese application No. 2021-192209; English machine translation included (7 pages).

* cited by examiner

*Primary Examiner* — Jeremy C Norris
(74) *Attorney, Agent, or Firm* — Rankin, Hill & Clark LLP

(57) ABSTRACT

A wiring board includes an insulating layer that is formed by using insulating resin and a wiring layer that is formed on a surface of the insulating layer. The wiring layer includes a first area in which a wire is formed, and a second area that includes a pad to which the wire formed in the first area is connected and that has a smaller wire width than the first area. The insulating layer includes a conductor portion that is formed by using a conductor in only a range that overlaps with the second area in plan view, and that is sandwiched between insulating resin.

5 Claims, 10 Drawing Sheets

| | | w [μm] | d [μm] | h [μm] | t [μm] | IMPEDANCE [Ω] |
|---|---|---|---|---|---|---|
| GLOBAL AREA | | 40 | 1.5 | 20 | 15 | 50.8861 |
| FAN-OUT AREA | PLAIN LAYER NOT PROVIDED | 13 | 1.5 | 20 | 15 | 81.14172 |
| | PLAIN LAYER PROVIDED | 13 | 1.5 | 7 | 15 | 51.69289 |

| | | w [μm] | d [μm] | h1 [μm] | h2 [μm] | t [μm] | s [μm] | IMPEDANCE [Ω] |
|---|---|---|---|---|---|---|---|---|
| GLOBAL AREA | | 28 | 1.5 | 33 | 33 | 15 | 75 | 50.17555 |
| FAN-OUT AREA | PLAIN LAYER NOT PROVIDED | 14 | 1.5 | 33 | 33 | 15 | 75 | 63.58157 |
| | PLAIN LAYER PROVIDED | 14 | 1.5 | 14 | 33 | 15 | 75 | 50.50145 |

WIRING BOARD

CROSS-REFERENCE TO RELATED APPLICATION

This application is based upon and claims the benefit of priority of the prior Japanese Patent Application No. 2021-192209, filed on Nov. 26, 2021, the entire contents of which are incorporated herein by reference.

FIELD

The embodiments discussed herein are related to a wiring board.

BACKGROUND

In general, a wiring board on which, for example, a semiconductor chip or the like is mounted includes pads for bonding the semiconductor chip or the like. Specifically, when the semiconductor chip is mounted by, for example, flip chip connection, a bump is formed on each of pads that are formed on the wiring board, and a plurality of terminals of the semiconductor chip are bonded to the bumps.

The pads of the wiring board are densely formed in accordance with positions of the terminals of the semiconductor chip, and therefore, in a fan-out area in the vicinities of the pads, an area in which wires drawn from the pads can be formed is limited. Therefore, in some cases, wire widths may be reduced in the fan-out area as compared to a unrestricted area in which wire widths for which impedance is optimized are adopted. By reducing the wire widths, it becomes possible to ensure distances between the wires and distances between the wires and the pads even in the fan-out area, so that it becomes possible to reduce crosstalk.

Patent Literature 1: Japanese Laid-open Patent Publication No. H9-18097

However, in the wiring board as described above, there is a problem in that impedance mismatch may occur. Specifically, if the wire widths are reduced in the fan-out area, impedance of the wires in the fan-out area increases. In contrast, in the unrestricted area that is separated from the pads, it is possible to relatively freely set the wire widths, so that the wires are formed with wire widths that optimize the impedance.

As a result, the wire widths are changed at a boundary between the fan-out area and the unrestricted area, so that impedance mismatch occurs. With an increase in an impedance difference due to the mismatch, signal reflection increases, so that signal transmission characteristics are degraded. Here, degradation of the transmission characteristics indicates a state in which a voltage of an input signal is not obtained at an output side but is attenuated. Furthermore, the impedance mismatch may cause reflection noise.

SUMMARY

According to an aspect of an embodiment, a wiring board includes an insulating layer that is formed by using insulating resin; and a wiring layer that is formed on a surface of the insulating layer, wherein the wiring layer includes a first area in which a wire is formed; and a second area that includes a pad to which the wire formed in the first area is connected and that has a smaller wire width than the first area, and the insulating layer includes a conductor portion that is formed by using a conductor in only a range that overlaps with the second area in plan view, and that is sandwiched between the insulating resin.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of a wiring board disclosed in the present application will be described in detail below with reference to the drawings. The present invention is not limited by the embodiments below.

First Embodiment

Figure 1:
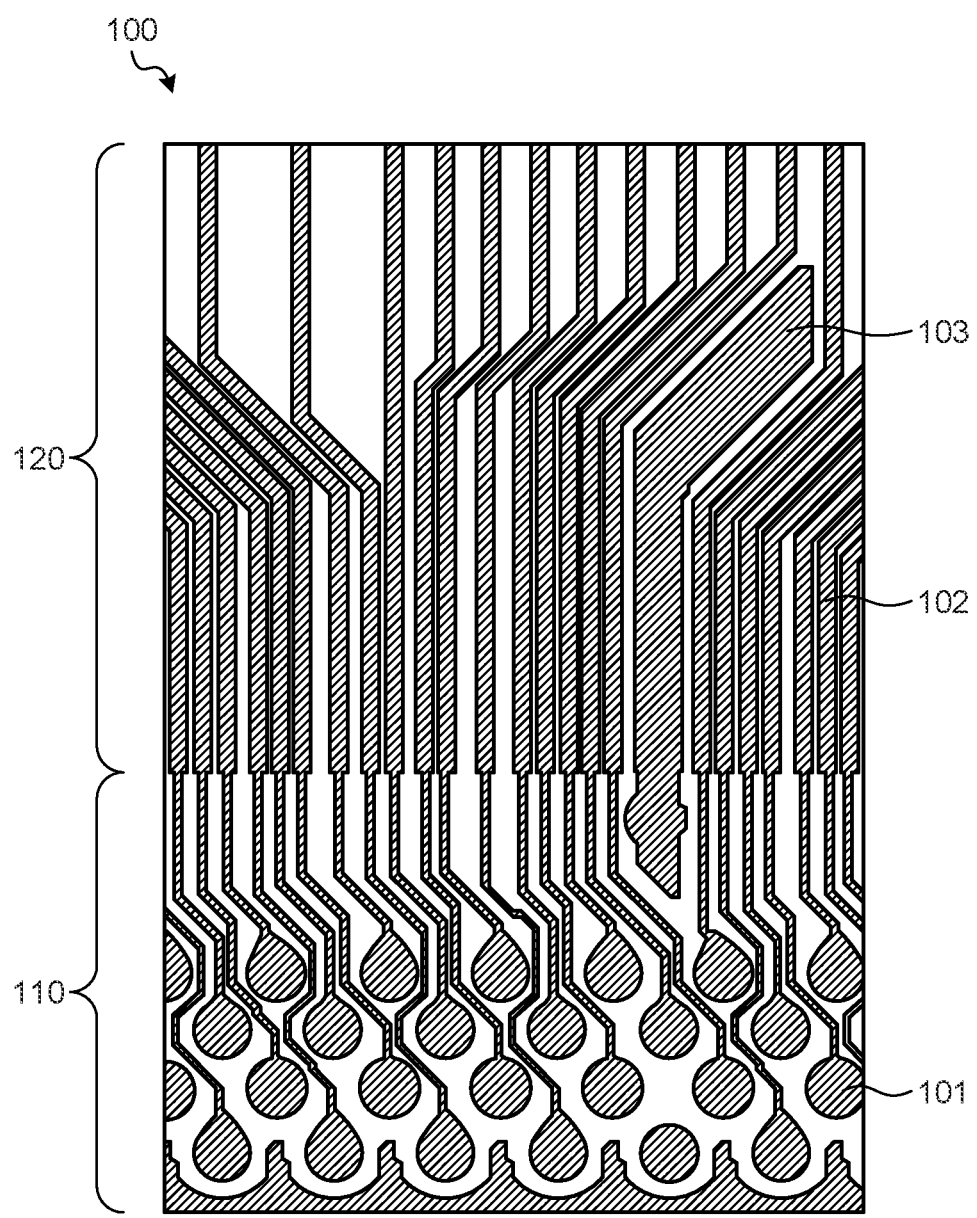
FIG. 1 is a partial plan view illustrating a configuration of a wiring board according to a first embodiment.

FIG. 1 is a partial plan view illustrating a configuration of a wiring board 100 according to a first embodiment. The wiring board 100 is, for example, a wiring board on which an electronic component, such as a semiconductor chip, is mountable, and FIG. 1 is a partial plan view of a periphery of an area in which a semiconductor chip is mounted. The wiring board 100 illustrated in FIG. 1 includes a fan-out area 110 and a unrestricted area 120.

The fan-out area 110 is an area including pads 101 for mounting a semiconductor chip. In the fan-out area 110, the plurality of pads 101 are formed in accordance with positions of terminals of the semiconductor chip, and wires 102 are drawn from the respective pads 101. The wires 102 are formed even between the pads 101, so that wire widths of the wires 102 are reduced in the fan-out area 110. Specifically, in the fan-out area 110, it is possible to perform setting such that L/S=about 9/12 micrometers (μm), for example. The wire widths of the wires 102 in the fan-out area 110 may be changed in a range of 5 to 20 μm for example, and a wire pitch between the wires 102 in the fan-out area 110 may be changed in a range of 5 to 20 μm for example.

The unrestricted area 120 is an area which is separated from the pads 101 and in which the wires 102 can be relatively freely wired. Therefore, in the unrestricted area 120, the wire widths of the wires 102 are adjusted and impedance is optimized, so that the wire widths of the wires 102 are increased as compared to the fan-out area 110 for example. Specifically, in the unrestricted area 120, it is possible to perform setting such that, for example, L/S=about 25/25 μm. The wire widths of the wires 102 in the unrestricted area 120 may be changed in a range of 20 to 40 μm for example, and the wire pitch between the wires 102 in the unrestricted area 120 may be changed in a range of 20 to 40 μm for example. Therefore, the wire widths of the wires 102 are changed at a boundary between the fan-out area 110 and the unrestricted area 120.

Furthermore, a ground pattern 103 that is connected to a ground power supply (not illustrated) is formed in the fan-out area 110 and the unrestricted area 120. The pads 101, the wires 102, and the ground pattern 103 are formed by using, for example, a conductor, such as copper or a copper alloy, and thicknesses may be set to about 10 to 20 μm for example.

In the wiring board 100 according to the present embodiment, a plain layer that is made of a conductor is formed in an inner layer of an area of the wires 102 in the fan-out area 110, and impedance of the wires 102 in the fan-out area 110 is reduced. Therefore, even if the wire widths of the wires 102 are changed at the boundary between the fan-out area 110 and the unrestricted area 120, impedance mismatch at the boundary is reduced.

Figure 2:
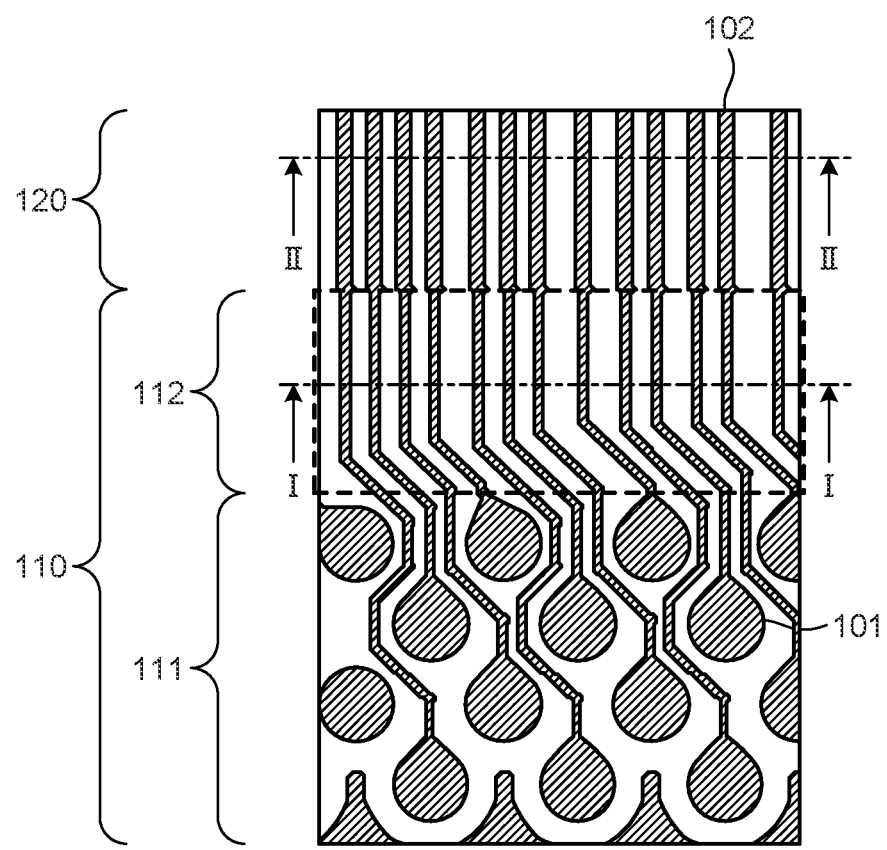
FIG. 2 is a diagram for explaining a position of a plain layer according to the first embodiment.

FIG. 2 is an enlarged plan view of a periphery of the fan-out area 110 of the wiring board 100. As illustrated in FIG. 2, the fan-out area 110 includes a pad area 111 in which the pads 101 are formed, and a thin-wire area 112 in which the wire widths of the wires 102 drawn from the pads 101 are reduced. Further, a plain layer that is made of a conductor is formed in an inner layer of the thin-wire area 112 that is enclosed by a dashed line in FIG. 2. The wires 102 in the thin-wire area 112 and the plain layer face each other, so that a capacity component is generated and the impedance of the wires 102 is reduced. As a result, it is possible to reduce impedance mismatch at the boundary between the fan-out area 110 and the unrestricted area 120.

Figure 3A:
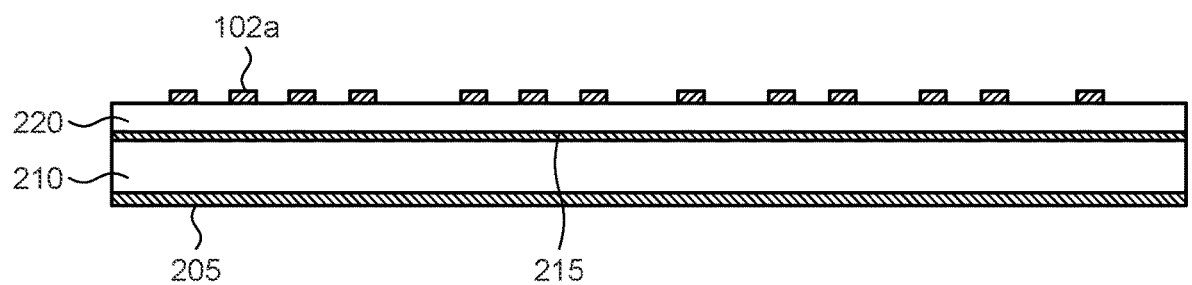
FIG. 3A is a cross-sectional view illustrating the configuration of the wiring board according to the first embodiment.
Figure 3B:
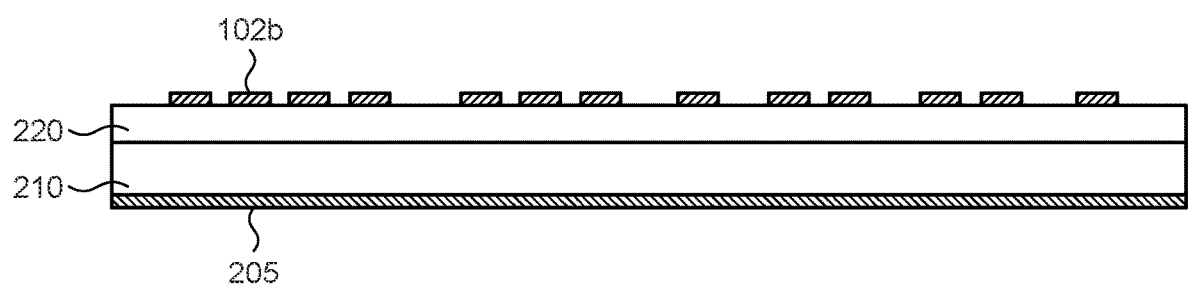
FIG. 3B is a cross-sectional view illustrating the configuration of the wiring board according to the first embodiment.

FIGS. 3A and 3B are a cross-sectional view illustrating the configuration of the wiring board 100 according to the first embodiment. Specifically, FIG. 3A illustrates a cross section taken along a line I-I in FIG. 2, and FIG. 3B illustrates a cross section taken along a line II-II in FIG. 2. As illustrated in FIGS. 3A and 3B, the wiring board 100 according to the present embodiment includes a microstripline.

As illustrated in FIG. 3A, in the thin-wire area 112 of the fan-out area 110, a first insulating layer 210 that covers a conductor layer 205 is formed, and a plain layer 215 is formed on an upper surface of the first insulating layer 210. Further, a second insulating layer 220 that covers the plain layer 215 is formed, and wires 102a with the small wire width are formed on an upper surface of the second insulating layer 220.

The conductor layer 205 is a ground pattern that is formed by using, for example, a conductor, such as copper or a copper alloy, and that is connected to the ground power supply (not illustrated). A thickness of the conductor layer 205 may be set to, for example, about 10 to 20 μm.

The first insulating layer 210 is formed by using insulating resin, such as epoxy resin or polyimide resin, and laminated on the conductor layer 205. A thickness of the first insulating layer 210 may be set to, for example, about 5 to 15 μm.

The plain layer 215 is a ground pattern that is formed by using a conductor, such as copper or a copper alloy, so as to cover the upper surface of the first insulating layer 210, and that is connected to the ground power supply (not illustrated). The plain layer 215 is formed in only a range that overlaps with the thin-wire area 112 of the fan-out area 110 in plan view, and generates a capacity component between the plain layer 215 and the wires 102a in the thin-wire area 112. Therefore, the impedance of the wires 102a is reduced. A thickness of the plain layer 215 may be set to, for example, about 5 to 20 μm.

A magnitude of the capacity component that is generated between the plain layer 215 and the wires 102a is determined depending on a distance between the plain layer 215 and the wires 102a, a surface area of the wires 102a, and permittivity of the second insulating layer 220. Therefore, by adjusting a thickness of the second insulating layer 220, it is possible to generate a desired capacity component between the plain layer 215 and the wires 102a and reduce the impedance of the wires 102a. Specifically, with a decrease in the distance between the plain layer 215 and the wires 102a by reducing the thickness of the second insulating layer 220, the capacity component to be generated is increased and the impedance of the wires 102a is reduced.

The second insulating layer 220 is formed by using insulating resin, such as epoxy resin or polyimide resin, and laminated on the plain layer 215. The thickness of the second insulating layer 220 may be set to, for example, about 5 to 10 μm, and is adjusted in accordance with the desired capacity component between the plain layer 215 and the wires 102a.

A wiring layer including the wires 102a with the small wire widths is formed on the upper surface of the second insulating layer 220. In the wiring layer of the thin-wire area 112, the ground pattern 103 may be formed in addition to the wires 102a.

In contrast, as illustrated in FIG. 3B, in the unrestricted area 120, the first insulating layer 210 and the second insulating layer 220 integrally cover the conductor layer 205, and the wires 102a with the large wire widths are formed on the upper surface of the second insulating layer 220. In other words, in the unrestricted area 120, the plain layer 215 is not formed, but a microstripline is formed in which an insulating layer formed of the first insulating layer 210 and the second insulating layer 220 is arranged between wires 102b and the conductor layer 205.

As described above, the plain layer 215 is formed in the thin-wire area 112 of the fan-out area 110, but the plain layer 215 is not formed in the unrestricted area 120. In other words, the plain layer 215 is formed in only a range that overlaps with the thin-wire area 112 in plan view and is sandwiched between insulating resin of the first insulating layer 210 and the second insulating layer 220. Therefore, the capacity component is generated between the plain layer 215 and the wires 102a with the small wire widths in the thin-wire area 112, so that the impedance of only the wires 102a is reduced. As a result, it is possible to reduce impedance mismatch between the wires 102a with the small wire widths and the wires 102a with the large wire widths.

A method of manufacturing the wiring board 100 configured as described above will be described below.

Figure 4:
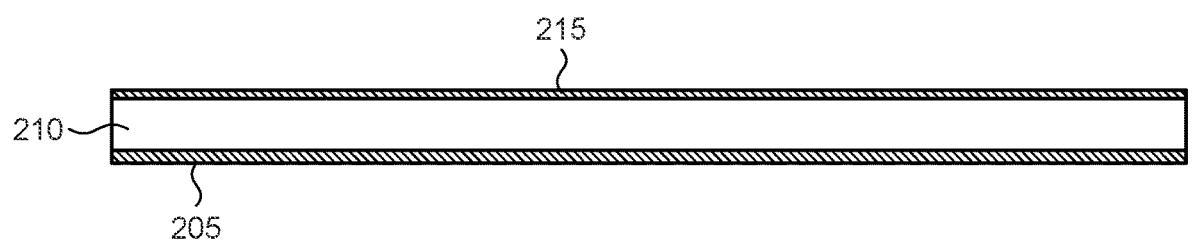
FIG. 4 is a diagram illustrating a specific example of a plain layer formation process.

First, for example, a copper foil is formed on the upper surface of the first insulating layer 210 that is laminated on the conductor layer 205. A thickness of the copper foil may be set to, for example, about 5 to 20 μm. Further, the copperfoil in an unwanted area is removed by, for example, etching, so that the plain layer 215 is formed as illustrated in FIG. 4. Specifically, the copper foil in an area corresponding to the pad area 111 of the fan-out area 110 and the unrestricted area 120 is removed, so that the copper foil in only the thin-wire area 112 of the fan-out area 110 remains and the plain layer 215 is formed.

Figure 5:
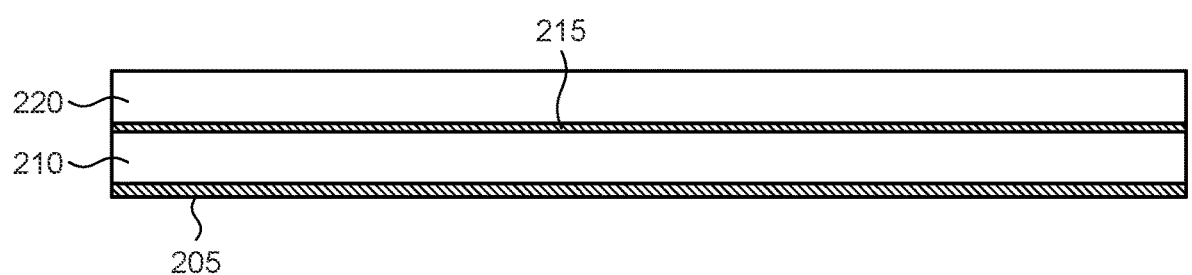
FIG. 5 is a diagram illustrating a specific example of a second insulating layer formation process.

After the plain layer 215 is formed, the second insulating layer 220 is laminated on the first insulating layer 210 and the plain layer 215. Specifically, the second insulating layer 220 is laminated on the plain layer 215 in the thin-wire area 112 of the fan-out area 110 as illustrated in FIG. 5 for example, and the second insulating layer 220 is laminated on the first insulating layer 210 in the pad area 111 of the fan-out area 110 and the unrestricted area 120.

Figure 6:
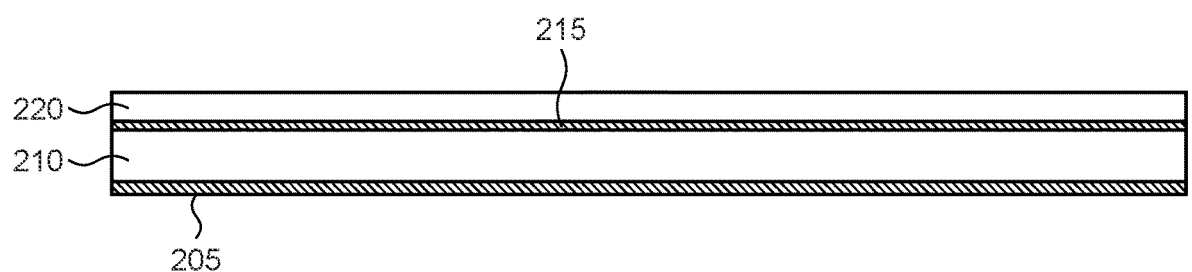
FIG. 6 is a diagram illustrating a specific example of a polishing process.

The second insulating layer 220 is polished by, for example, chemical mechanical polishing (CMP) or blast, and machined to have a certain thickness for reducing the impedance of the wires 102a with the smaller wire widths to a desired value. Specifically, as illustrated in FIG. 6 for example, the upper surface of the second insulating layer 220 is polished and a distance between the plain layer 215 and the upper surface of the second insulating layer 220 is adjusted. Through the polishing as described above, the thickness of the second insulating layer 220 is set to, for example, about 5 to 10 μm.

Figure 7:
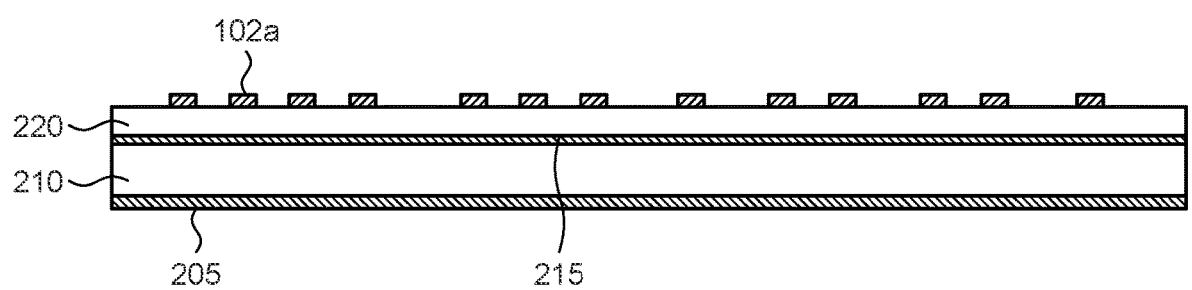
FIG. 7 is a diagram illustrating a specific example of a wiring layer formation process.

Further, the wiring layer is formed on the upper surface of the second insulating layer 220. Specifically, the wiring layer including the pads 101, the wires 102, and the ground pattern 103 is formed on the upper surface of the second insulating layer 220. The wiring layer may be formed by a semi additive method using plating or a subtractive method using etching. At this time, as illustrated in FIG. 7 for example, the wires 102a with the small wire widths are formed in the fan-out area 110. In contrast, the wires 102b with the large wire widths are formed in the unrestricted area 120. The wire widths of the wires 102a in the fan-out area 110 may be set to, for example, about 10 to 20 μm, and the wire widths of the wires 102b in the unrestricted area 120 may be set to, for example, about 20 to 40 μm.

Through the processes as described above, it is possible to manufacture the wiring board 100 that includes the plain layer 215 in only the thin-wire area 112 of the fan-out area 110.

Figures 8A, 8B:
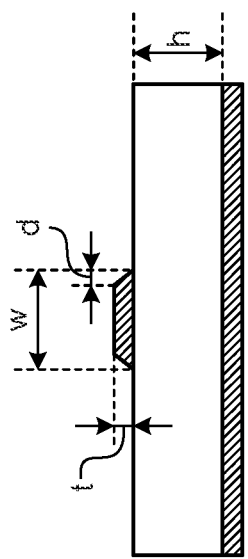
FIG. 8A is a diagram illustrating a simulation result.
FIG. 8B is a diagram illustrating a simulation result.

FIGS. 8A and 8B illustrate a simulation result of the impedance of the wires 102 of the wiring board 100 that is configured as described above. The wires 102 form a microstripline as illustrated in FIG. 8A. As illustrated in FIG. 8A and FIG. 8B, wire widths w of the wires 102a in the fan-out area 110 are set to 13 μm and the wire widths w of the wires 102b in the unrestricted area 120 are set to 40 μm. Further, a distance h from the wires 102b to the conductor layer 205 (in other words, a total thickness of the first insulating layer 210 and the second insulating layer 220) in the unrestricted area 120 is set to 20 μm, and a distance h from the wires 102a to the plain layer 215 (in other words, the thickness of the second insulating layer 220) in the fan-out area 110 is set to 7 μm. A thickness t of each of the wires 102a and 102b is set to 15 μm.

In this case, the impedance of the wires 102b in the unrestricted area 120 is optimized to around 50Ω. Further, in the fan-out area 110, the impedance of the wires 102a reaches about 81Ω if the plain layer 215 is not provided, but the impedance of the wires 102a is reduced to about 52Ω by formation of the plain layer 215. In other words, by forming the plain layer 215, it is possible to reduce impedance mismatch at the boundary between the unrestricted area 120 and the fan-out area 110.

As described above, according to the present embodiment, the plain layer is formed in the inner layer of the thin-wire area of the fan-out area, so that the capacity component is generated between the wires in the thin-wire area and the plain layer and the impedance of the wires is reduced. As a result, it is possible to reduce impedance mismatch between the wires with the large wire widths in the unrestricted area and the wires with the small wire widths in the fan-out area.

Second Embodiment

A feature of a second embodiment is that a plain layer that is spread over the entire fan-out area and that does not overlap with the pads is provided.

A plan view of the wiring board 100 according to the second embodiment is the same as the first embodiment (FIG. 1), and therefore, explanation thereof will be omitted.

Figure 9:
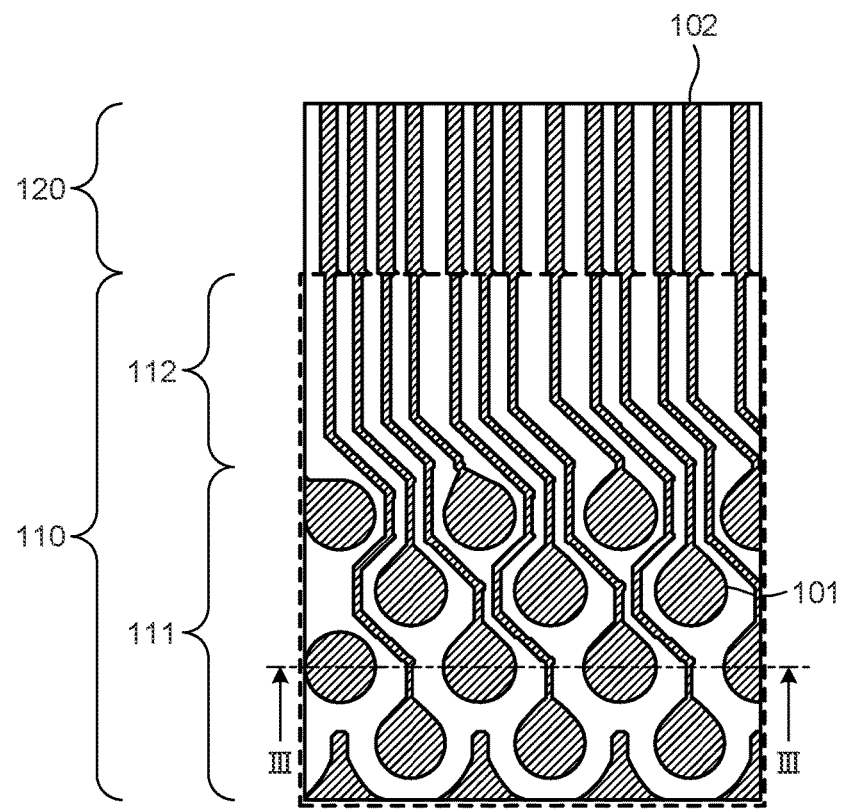
FIG. 9 is a diagram for explaining a position of a plain layer according to a second embodiment.

FIG. 9 is an enlarged plan view of a periphery of the fan-out area 110 of the wiring board 100 according to the second embodiment. As illustrated in FIG. 9, the fan-out area 110 includes the pad area 111 in which the pads 101 are formed, and the thin-wire area 112 in which the wire widths of the wires 102 drawn from the pads 101 are reduced. Further, the plain layer 215 that is made of a conductor is formed in the inner layer of the fan-out area 110 that is enclosed by a dashed line in FIG. 9. The plain layer 215 includes through holes at positions overlapping with the pads 101 in plan view, and faces only the pad area 111 and the wires 102 in the thin-wire area 112. The wires 102 in the fan-out area 110 and the plain layer 215 face each other, so that a capacity component is generated and the impedance of the wires 102 is reduced. As a result, it is possible to reduce impedance mismatch at the boundary between the fan-out area 110 and the unrestricted area 120.

Figure 10:
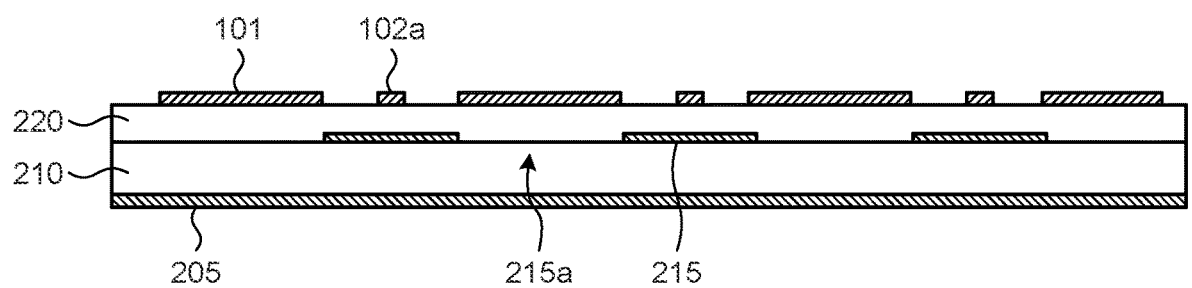
FIG. 10 is a cross-sectional view illustrating a configuration of a wiring board according to the second embodiment.

FIG. 10 is a cross-sectional view illustrating a configuration of the wiring board 100 according to the second embodiment. Specifically, FIG. 10 is a cross-sectional view illustrating a cross section taken along a line III-III in FIG. 9.

As illustrated in FIG. 10, in the pad area 111 of the fan-out area 110, the first insulating layer 210 that covers the conductor layer 205 is formed and the plain layer 215 is formed on the upper surface of the first insulating layer 210. Further, the second insulating layer 220 that covers the plain layer 215 is formed, and the wires 102a with the small wire widths are formed on the upper surface of the second insulating layer 220.

The plain layer 215 according to the present embodiment has a certain shape that covers the upper surface of the first insulating layer 210 in only an area that faces the wires 102a with the small wire widths, and includes through holes 215a in areas overlapping with the pads 101. Therefore, a capacity component is not generated in the pads 101, and it is possible to reduce the impedance of only the wires 102a even in the pad area 111. As a result, it is possible to reduce the impedance of the wires 102a in the entire fan-out area 110, so that it is possible to reduce impedance mismatch with the wires 102b with the large wire width in the unrestricted area 120.

As described above, according to the present embodiment, the plain layer that faces the wires is formed in the inner layer of the fan-out area, so that the capacity component is generated between the wires in the fan-out area and the plain layer and the impedance of the wires is reduced. As a result, it is possible to reduce impedance mismatch between the wires with the large wire widths in the unrestricted area and the wires with the small wire widths in the fan-out area.

Meanwhile, in the first and the second embodiments as described above, it is assumed that the wiring board 100 includes the microstripline, but even if the wiring board 100 includes a stripline, it is possible to reduce impedance mismatch by providing the plain layer 215.

Figure 11A:
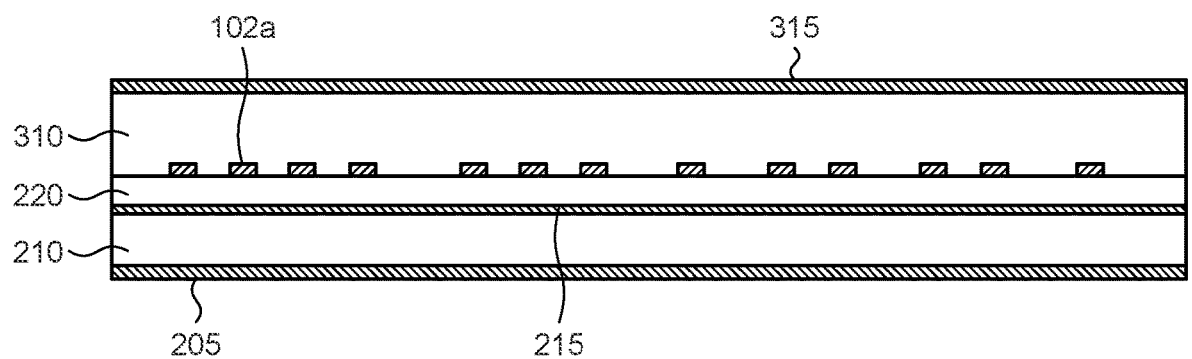
FIG. 11A is a cross-sectional view illustrating a wiring board according to a modification.
Figure 11B:
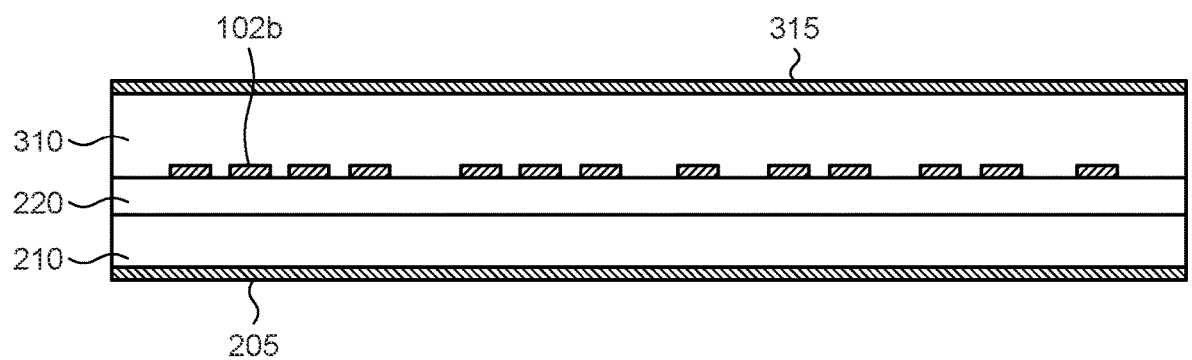
FIG. 11B is a cross-sectional view illustrating a wiring board according to a modification.

FIGS. 11A and 11B are a cross-sectional view illustrating the wiring board 100 according to a modification. Specifically, FIG. 11A illustrates a cross section of the thin-wire area 112 of the fan-out area 110, and FIG. 11B illustrates a cross section of the unrestricted area 120. As illustrated in FIGS. 11A and 11B, the wiring board 100 includes a stripline.

As illustrated in FIG. 11A, in the thin-wire area 112 of the fan-out area 110, a third insulating layer 310 and a conductor layer 315 are formed on an upper layer of the conductor layer 205, the first insulating layer 210, the plain layer 215, the second insulating layer 220, and the wires 102a illustrated in FIG. 3A.

The third insulating layer 310 is formed by using insulating resin, such as epoxy resin or polyimide resin, and laminated on the wiring layer including the wires 102a. A thickness of the third insulating layer 310 may be set to, for example, about 20 to 40 μm.

The conductor layer 315 is a ground pattern that is formed by using, for example, a conductor, such as copper or a copper alloy, so as to cover an upper surface of the third insulating layer 310, and that is connected to the ground power supply (not illustrated). A thickness of the conductor layer 315 may be set to, for example, about 10 to 20 μm.

In contrast, as illustrated in FIG. 11B, in the unrestricted area 120, the first insulating layer 210 and the second insulating layer 220 integrally cover the conductor layer 205, and the wires 102a with the large wire widths are formed on the upper surface of the second insulating layer 220. Further, the third insulating layer 310 and the conductor layer 315 are formed on the upper layer of the wires 102b. In other words, in the unrestricted area 120, the stripline is formed in which the plain layer 215 is not formed, the wires 102b are sandwiched between an insulating layer that is formed of the first insulating layer 210 and the second insulating layer 220 and the third insulating layer 310, and the conductor layer 205 and the conductor layer 315 are laminated on the insulating layers.

As described above, even if the wiring board 100 includes the stripline, by forming the plain layer 215 in only the thin-wire area 112 of the fan-out area 110, it is possible to reduce the impedance of only the wires 102a and it is possible to reduce impedance mismatch with the wires 102b.

Figures 12A, 12B:
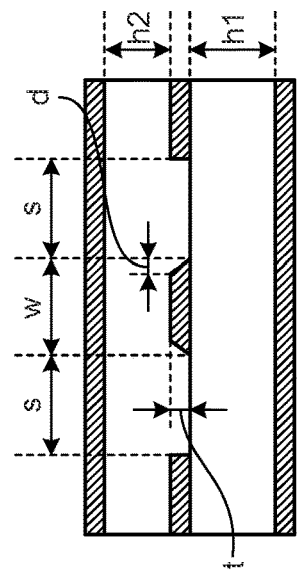
FIG. 12A is a diagram illustrating a simulation result.
FIG. 12B is a diagram illustrating a simulation result.

FIGS. 12A and 12B illustrate a simulation result of the impedance of the wires 102 of the wiring board 100 that is configured as described above. The wires 102 form a stripline as illustrated in FIG. 12A. As illustrated in FIGS. 12A and 12B, the wire widths w of the wires 102a in the fan-out area 110 are set to 14 μm, and the wire widths w of the wires 102b in the unrestricted area 120 are set to 28 μm. Further, a distance h1 from the wires 102b to the conductor layer 205 (in other words, a total thickness of the first insulating layer 210 and the second insulating layer 220) in the unrestricted area 120 is set to 33 μm, and a distance h1 from the wires 102a to the plain layer 215 (in other words, the thickness of the second insulating layer 220) in the fan-out area 110 is set to 14 μm. The thickness t of each of the wires 102a and 102b is set to 15 μm, and a thickness h2 of the third insulating layer 310 is set to 33 μm.

In this case, the impedance of the wires 102b in the unrestricted area 120 is optimized to around 50Ω. Further, in the fan-out area 110, the impedance of the wires 102a reaches about 64 Ω if the plain layer 215 is not provided, but the impedance of the wires 102a is reduced to about 51 Ω by formation of the plain layer 215. In other words, by forming the plain layer 215, it is possible to reduce impedance mismatch at the boundary between the unrestricted area 120 and the fan-out area 110.

Furthermore, even if the wiring board 100 includes the stripline, similarly to the second embodiment as described above, it is possible to arrange the plain layer 215 that is spread over the entire fan-out area and that does not overlap with the pads 101.

Figure 13:
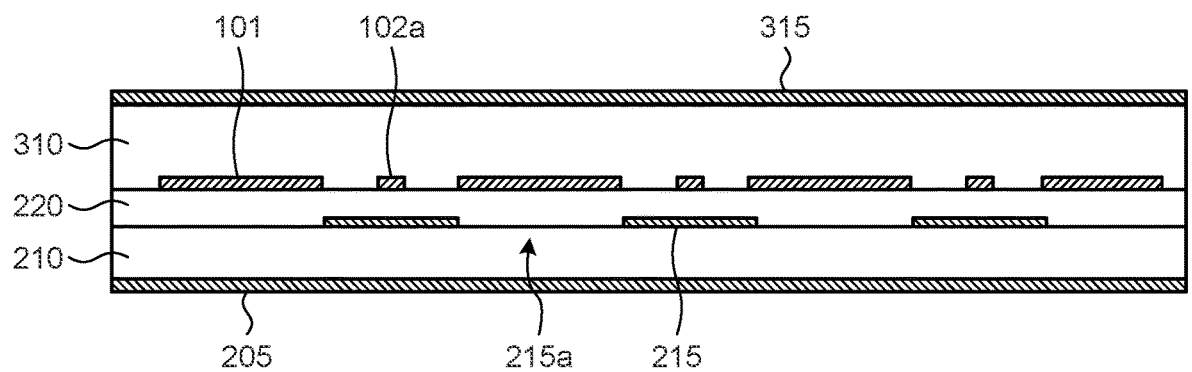
FIG. 13 is a cross-sectional view illustrating a wiring board according to another modification.

Specifically, FIG. 13 is a cross-sectional view illustrating a modification of the cross section taken along the line III-III in FIG. 9. In FIG. 13, the same components as those in FIGS. 10, 11A and 11B are denoted by the same reference symbols. As illustrated in FIG. 13, the wiring board 100 includes a stripline. In other words, as illustrated in FIG. 13, in the pad area 111 of the fan-out area 110, the third insulating layer 310 and the conductor layer 315 are formed on the upper layer of the conductor layer 205, the first insulating layer 210, the plain layer 215, the second insulating layer 220, and the wires 102a.

The plain layer 215 has a certain shape that covers the upper surface of the first insulating layer 210 in only an area that faces the wires 102a with the small wire widths, and includes the through holes 215a in areas overlapping with the pads 101. Therefore, a capacity component is not generated in the pads 101, and it is possible to reduce the impedance of only the wires 102a even in the pad area 111. As a result, it is possible to reduce the impedance of the wires 102a in the entire fan-out area 110, so that it is possible to reduce impedance mismatch with the wires 102b with the large wire width in the unrestricted area 120.

In each of the embodiments as described above, it is assumed that the wiring board 100 includes the wires 102 in the single wiring layer, but the wiring board 100 may be configured as a multi-layer substrate. In other words, it may be possible to laminate one or more insulating layers and conductor layers below the conductor layer 205 of the wiring board 100 according to the first and the second embodiments as described above.

According to one embodiment of the wiring board disclosed in the present application, it is possible to reduce impedance mismatch.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   an insulating layer that is formed by using insulating resin; and
   a wiring layer that is formed on a surface of the insulating layer, wherein
   the wiring layer includes
      a first area in which a wire is formed; and
      a second area that includes a pad to which the wire formed in the first area is connected, the pad having a larger size along a width direction of the wire than the wire, and the second area having a smaller wire width than the first area,
   the insulating layer includes a conductor portion that is formed by using a conductor in only a range that overlaps with the second area in plan view, and that is sandwiched between the insulating resin,
   the pad comprises a plurality of pads,
   a wire formed in the second area is positioned in a position sandwiched between the plurality of pads and overlaps with the conductor portion in plan view, and
   the conductor portion includes through holes at positions overlapping with the plurality of pads.

2. The wiring board according to claim 1, further comprising:
   a conductor layer that covers a surface of the insulating layer, the surface being opposite to the surface on which the wiring layer is formed, and that is formed in a range that overlaps with the first area and the second area in plan view.

3. The wiring board according to claim 1, wherein the conductor portion is connected to a ground power supply.

4. The wiring board according to claim 1, further comprising:
   another insulating layer that covers the wiring layer; and
   another conductor layer that is laminated on the other insulating layer.

5. The wiring board according to claim 1, wherein the surface of the insulating layer is a polished surface.

* * * * *